(12) United States Patent
Howard et al.

(10) Patent No.: US 11,444,461 B2
(45) Date of Patent: Sep. 13, 2022

(54) SYSTEM AND METHOD FOR DYNAMICALLY ESTIMATING INVERTER-BASED RESOURCE REACTIVE POWER CAPABILITY

(71) Applicant: General Electric Company, Schenectady, NY (US)

(72) Inventors: Dustin Howard, Atlanta, GA (US); Alfredo Sebastian Achilles, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 99 days.

(21) Appl. No.: 16/905,992

(22) Filed: Jun. 19, 2020

(65) Prior Publication Data
US 2021/0399550 A1 Dec. 23, 2021

(51) Int. Cl.
*H02J 3/18* (2006.01)
*F03D 17/00* (2016.01)
*F03D 9/25* (2016.01)
*G01R 21/133* (2006.01)
*H02J 3/38* (2006.01)

(52) U.S. Cl.
CPC ............ *H02J 3/1892* (2013.01); *F03D 9/257* (2017.02); *F03D 17/00* (2016.05); *G01R 21/1331* (2013.01); *H02J 3/1885* (2013.01); *H02J 3/381* (2013.01); *H02J 2300/28* (2020.01)

(58) Field of Classification Search
CPC .. H02J 3/1885; H02J 3/381; H02J 3/28; H02J 3/50; H02J 3/1892; H02J 2300/28; F03D 9/257; F03D 17/00; G01R 21/1331
See application file for complete search history.

(56) References Cited

U.S. PATENT DOCUMENTS

| 7,119,452 | B2 | 10/2006 | Larsen |
| 10,570,882 | B2 | 2/2020 | Hardwicke, Jr. et al. |
| 2016/0237990 | A1* | 8/2016 | Ubben .................. H02J 3/18 |
| 2019/0145376 | A1* | 5/2019 | Hardwicke, Jr. ..... F03D 7/0272 |
| | | | 700/287 |
| 2020/0373759 | A1* | 11/2020 | Samaan ................ H02J 3/383 |
| 2021/0184462 | A1* | 6/2021 | Gupta .................... H02J 3/18 |

OTHER PUBLICATIONS

European Search Report for EP Application No. 21179564.6, dated Nov. 12, 2021.

* cited by examiner

*Primary Examiner* — Harry R Behm
(74) *Attorney, Agent, or Firm* — Dority & Manning, P.A.

(57) ABSTRACT

A method for controlling a power system includes generating, via at least one inverter-based resource, one or more command signals via a regulator of at least one inverter-based resource of the power system. Further, the method includes dynamically estimating, via the at least one inverter-based resource, a reactive power capability of the at least one inverter-based resource based, at least in part, on the one or more command signals. Further, the method includes sending, via the at least one inverter-based resource, the reactive power capability to the system-level controller. Thus, the method includes controlling the power system based on the reactive power capability.

13 Claims, 6 Drawing Sheets

SYSTEM AND METHOD FOR DYNAMICALLY ESTIMATING INVERTER-BASED RESOURCE REACTIVE POWER CAPABILITY

FIELD

The present disclosure relates generally inverter-based resources and, more particularly, to systems and methods for dynamically estimating inverter-based resource reactive power capability to improve plant-level volt/VAR control.

BACKGROUND

Wind power is considered one of the cleanest, most environmentally friendly energy sources presently available and wind turbines have gained increased attention in this regard. A modern wind turbine typically includes a tower, a generator, a gearbox, a nacelle, and one or more rotor blades. The rotor blades are the primary elements for converting wind energy into electrical energy. The blades typically have the cross-sectional profile of an airfoil such that, during operation, air flows over the blade producing a pressure difference between its sides. Consequently, a lift force, which is directed from the pressure side towards the suction side, acts on the blade. The lift force generates torque on the main rotor shaft, which is connected to a generator for producing electricity that is transferred to a power grid. The power grid transmits electrical energy from generating facilities to end users.

Wind power generation is typically provided by a wind farm, which contains a plurality of wind turbine generators (e.g. often 100 or more). Typical wind farms have a farm-level controller that regulates the voltage, reactive power, and/or power factor at the wind farm interconnection point (i.e. the point at which the local wind turbine generators are connected to the grid; may also be referred to as the point of common coupling). In such wind farms, the farm-level controller achieves its control objectives by sending reactive power or reactive current commands to the individual wind turbine generators within the wind farm. However, certain constraints of the local wind turbine generators within the wind farm can constrain the capability to supply reactive power. Such constraints, may include, for example, voltage limits, reactive power limits, and/or current limits.

More specifically, when one or more of the wind turbine generators reaches one of the above constraints, the local turbine-level controllers may not be able to follow the requested reactive power command from the farm-level controller. Additionally, reaching one of the above constraints may cause a turbine-level controller to enter a different control mode, resulting in controller action that reduces priority of following the farm-level controller command. If the farm-level controller is not aware of these constraints, the farm-level controller may continue to increase or decrease its reactive power command without the expected change in its feedback, leading to windup of the farm-level controller.

Accordingly, the art is continuously seeking new and improved systems and methods for dynamically estimating wind turbine generator reactive power capability to improve farm-level volt/VAR control.

BRIEF DESCRIPTION

Aspects and advantages of the invention will be set forth in part in the following description, or may be obvious from the description, or may be learned through practice of the invention.

In one aspect, the present disclosure is directed to a method for controlling a power system. The method includes generating, via at least one inverter-based resource of the power system, one or more command signals via a regulator of at least one inverter-based resource. Further, the method includes dynamically estimating, via the at least one inverter-based resource, a reactive power capability of the at least one inverter-based resource based, at least in part, on a reactive power feedback signal and the one or more command signals. Further, the method includes sending, via the at least one inverter-based resource, the reactive power capability to a system-level controller of the power system. Thus, the method includes controlling the power system based on the reactive power capability.

In an embodiment, the command signal(s) may include voltage command signals, reactive power command signals, and/or reactive current command signals.

In another embodiment, the method may include dynamically estimating the reactive power capability of the at least one inverter-based resource based, at least in part, on the command signal(s) and upper and lower limits of the regulator.

In additional embodiments, the reactive power capability may include a reactive power capability upper value and a reactive power capability lower value.

Thus, in an embodiment, dynamically estimating the reactive power capability of the at least one inverter-based resource may include if the one or more command signals equal the upper limit, then setting the reactive power capability upper value equal to the reactive power feedback signal and the reactive power capability lower value equal to a lower reactive power equipment rating for the at least one inverter-based resource.

In another embodiment, dynamically estimating the reactive power capability of the at least one inverter-based resource may include if the one or more command signals equal the lower limit, then setting the reactive power capability upper value equal to a upper reactive power equipment rating for the at least one inverter-based resource and the reactive power capability lower value equal to the reactive power feedback signal.

In further embodiments, dynamically estimating the reactive power capability of the at least one inverter-based resource may include if the one or more command signals do not equal the upper or lower limits, then setting the reactive power capability upper value equal to the upper reactive power equipment rating for the at least one inverter-based resource and the reactive power capability lower value equal to the lower reactive power equipment rating for the at least one inverter-based resource.

In certain embodiments, sending the reactive power capability to the system-level controller may include sending, via the at least one inverter-based resource, the reactive power capability upper value and the reactive power capability lower value to the system-level controller and setting upper and lower limits of a regulator of the system-level controller equal to the reactive power capability upper and lower values from the at least one inverter-based resource.

In particular embodiments, controlling the power system based on the reactive power capability may include generating a reactive power command for the at least one inverter-based resource using the regulator of the system-level controller with the reactive power capability upper and lower values from the at least one inverter-based resource set as the upper and lower limits of the regulator of the system-level controller.

In further embodiments, the power system may include a plurality of inverter-based resources, with the at least one inverter-based resource being one of the plurality of inverter-based resources. In such embodiments, the method may include generating, via a plurality of inverter-based resources, a plurality of the one or more command signals via a plurality of regulators from the plurality of inverter-based resources, dynamically estimating, via the plurality of inverter-based resources, a plurality of reactive power capabilities for the inverter-based resources based, at least in part, on the plurality of the one or more command signals, sending, via the plurality of inverter-based resources, the plurality of reactive power capabilities for the inverter-based resources to the system-level controller, and controlling the power system based on the plurality of reactive power capabilities.

In another aspect, the present disclosure is directed to a wind farm. The wind farm includes a plurality of wind turbine generators, a plurality of turbine-level controllers for controlling the plurality of wind turbine generators, and a farm-level controller commutatively coupled to the plurality of turbine-level controllers. Each of the turbine-level controllers perform a plurality of operations, including but not limited to generating one or more command signals via a regulator of a respective wind turbine generator of the plurality of wind turbine generators of the wind farm, dynamically estimating a reactive power capability of the respective wind turbine generator based, at least in part, on a reactive power feedback signal and the one or more command signals, and sending the reactive power capability to the farm-level controller. Thus, the farm-level controller controls the wind farm based on the reactive power capability.

In an embodiment, the reactive power commands may be distributed to the plurality of inverter-based resources so as to have unconstrained inverter-based resources within the power system compensate for any reduction in reactive power capabilities due to constrained inverter-based resources within the power system.

It should be understood that the wind farm may further include any additional features and/or embodiments described herein.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Generally, the present disclosure is directed to a systems and methods for coordinating the inverter-based resource control and system-level control via sending dynamic estimations of reactive power capability from the inverter-based resources to the system-level control. Although the present technology described herein is explained with reference to a wind farm having a plurality of wind turbine generators, it should be understood that the present technology may also be implemented for any suitable application having the ability to rapidly control reactive power. As used herein, inverter-based resources generally refer to electrical devices that can generate or absorb electric power through switching of power-electronic devices. Accordingly, inverter-based resource may include wind turbine generators, solar inverters, energy-storage systems, STATCOMs, or hydro-power systems.

Figure 1:
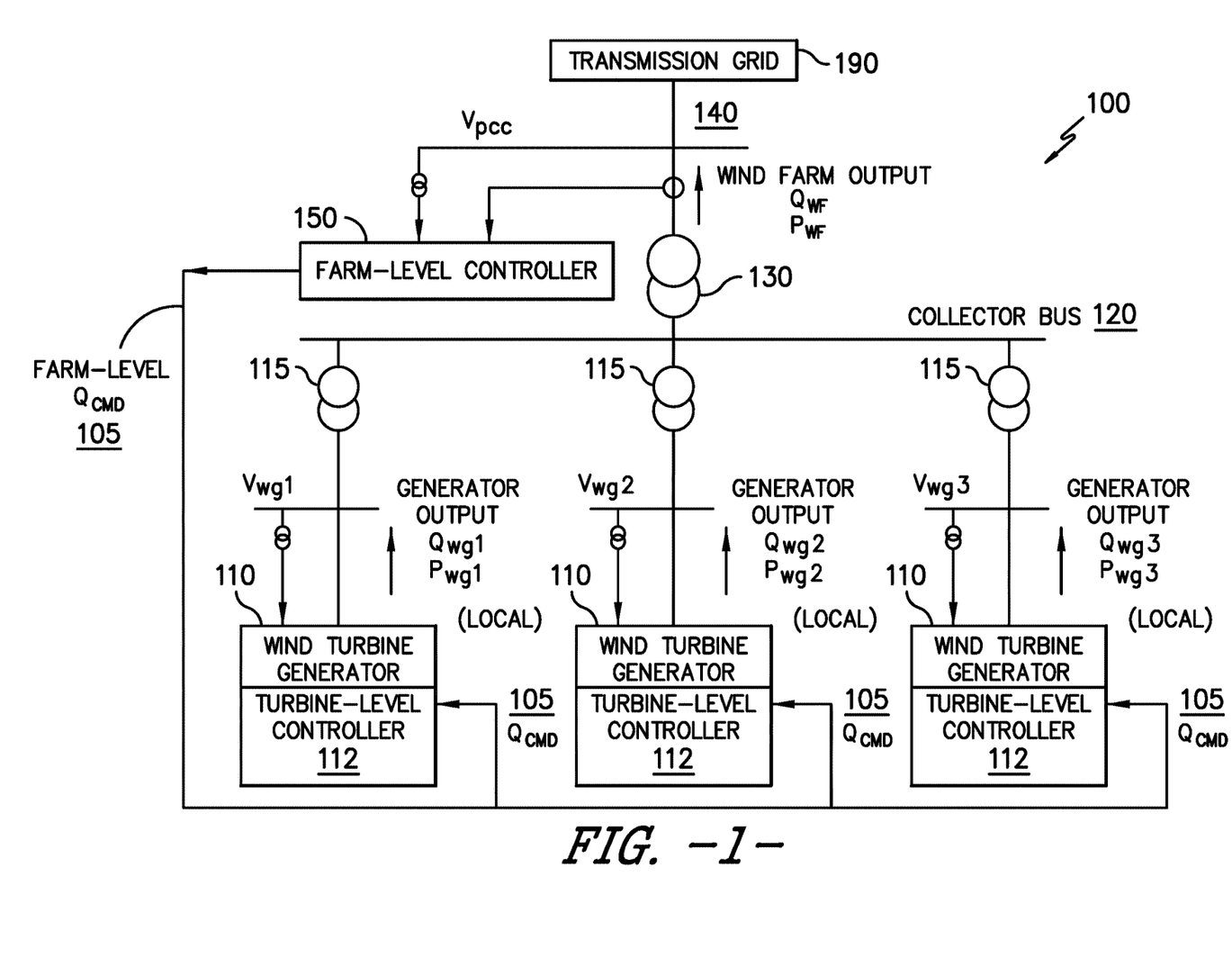
FIG. 1 illustrates a block diagram of a wind farm having multiple wind turbine generators coupled with a transmission grid according to the present disclosure.

Referring now to the drawings, FIG. 1 illustrates a block diagram of a wind farm 100 having a plurality of wind turbine generators 110 coupled with a transmission grid 190. FIG. 1 illustrates three wind generators 110; however, any number of wind generators can be included in a wind farm 100. Further, as shown, each of the wind turbine generators 110 includes a local controller 112 that is responsive to the conditions of the wind turbine generator 110 being controlled. In one embodiment, the controller for each wind turbine generator senses only the terminal voltage and current (via potential and current transformers). The sensed voltage and current are used by the local controller to provide an appropriate response to cause the wind turbine generator 110 to provide the desired reactive power.

Each wind turbine generator 110 is coupled to collector bus 120 through generator connection transformers 115 to provide real and reactive power (labeled $P_{wg}$ and $Q_{wg}$, respectively) to the collector bus 120. Generator connection transformers and collector buses are known in the art.

The wind farm 100 provides real and reactive power output (labeled $P_{wf}$ and $Q_{wf}$, respectively) via wind farm main transformer 130. The farm-level controller 150, which is communicatively coupled to the turbine-level controllers 112, senses the wind farm output, as well as the voltage at the point of common coupling (PCC) 140, to provide a Q command signal 105 ($Q_{CMD}$) that indicates desired reactive power at the generator terminals to ensure a reasonable distribution of reactive power among the wind turbines. In alternate embodiments, the Q command signal ($Q_{CMD}$) 105 may be generated as the local or operator level (indicated by the "LOCAL" lines in FIG. 1), for example in the event that the wind turbine generator(s) is in manual mode or otherwise not in communication with the wind farm-level controller 150.

Figure 2:
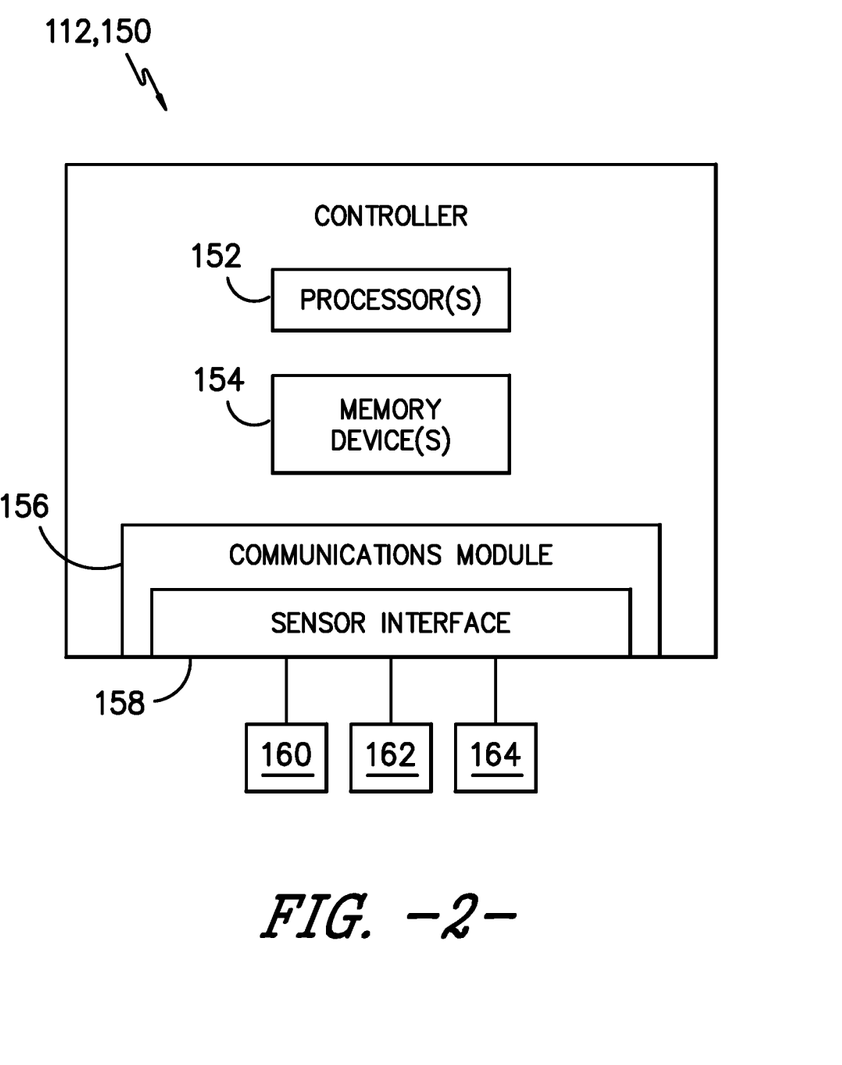
FIG. 2 illustrates a block diagram of suitable components that may be included in one embodiment of a farm-level controller according to the present disclosure.

Referring now to FIG. 2, a block diagram of one embodiment of suitable components that may be included within the turbine-level controllers 112 and/or the farm-level controller 150 in accordance with aspects of the present disclosure is illustrated. As shown, the controller 112, 150 may include one or more processor(s) 152 and associated memory device(s) 154 configured to perform a variety of computer-implemented functions (e.g., performing the methods, steps, calculations and the like and storing relevant data as disclosed herein). Additionally, the controller 112, 150 may also include a communications module 156 to facilitate communications between the controller 112, 150 and the various components of the wind farm 100. Further, the communications module 156 may include a sensor interface 158 (e.g., one or more analog-to-digital converters) to permit signals transmitted from one or more sensors 160, 162, 164 to be converted into signals that can be understood and processed by the processors 152. It should be appreciated that the sensors 160, 162, 164 may be communicatively coupled to the communications module 156 using any suitable means. For example, as shown, the sensors 160, 162, 164 are coupled to the sensor interface 158 via a wired connection. However, in other embodiments, the sensors 160, 162, 164 may be coupled to the sensor interface 158 via a wireless connection, such as by using any suitable wireless communications protocol known in the art.

As used herein, the term "processor" refers not only to integrated circuits referred to in the art as being included in a computer, but also refers to a controller, a microcontroller, a microcomputer, a programmable logic controller (PLC), an application specific integrated circuit, and other programmable circuits. Additionally, the memory device(s) 154 may generally comprise memory element(s) including, but not limited to, computer readable medium (e.g., random access memory (RAM)), computer readable non-volatile medium (e.g., a flash memory), a floppy disk, a compact disc-read only memory (CD-ROM), a magneto-optical disk (MOD), a digital versatile disc (DVD) and/or other suitable memory elements. Such memory device(s) 154 may generally be configured to store suitable computer-readable instructions that, when implemented by the processor(s) 152, configure the controller 112, 150 to perform various functions as described herein.

The sensors 160, 162, 164 may include any suitable sensors configured to provide feedback measurements to the farm-level controller 150. In various embodiments, for example, the sensors 160, 162, 164 may be any one of or combination of the following: voltage sensors, current sensors, and/or any other suitable sensors.

Figure 3:
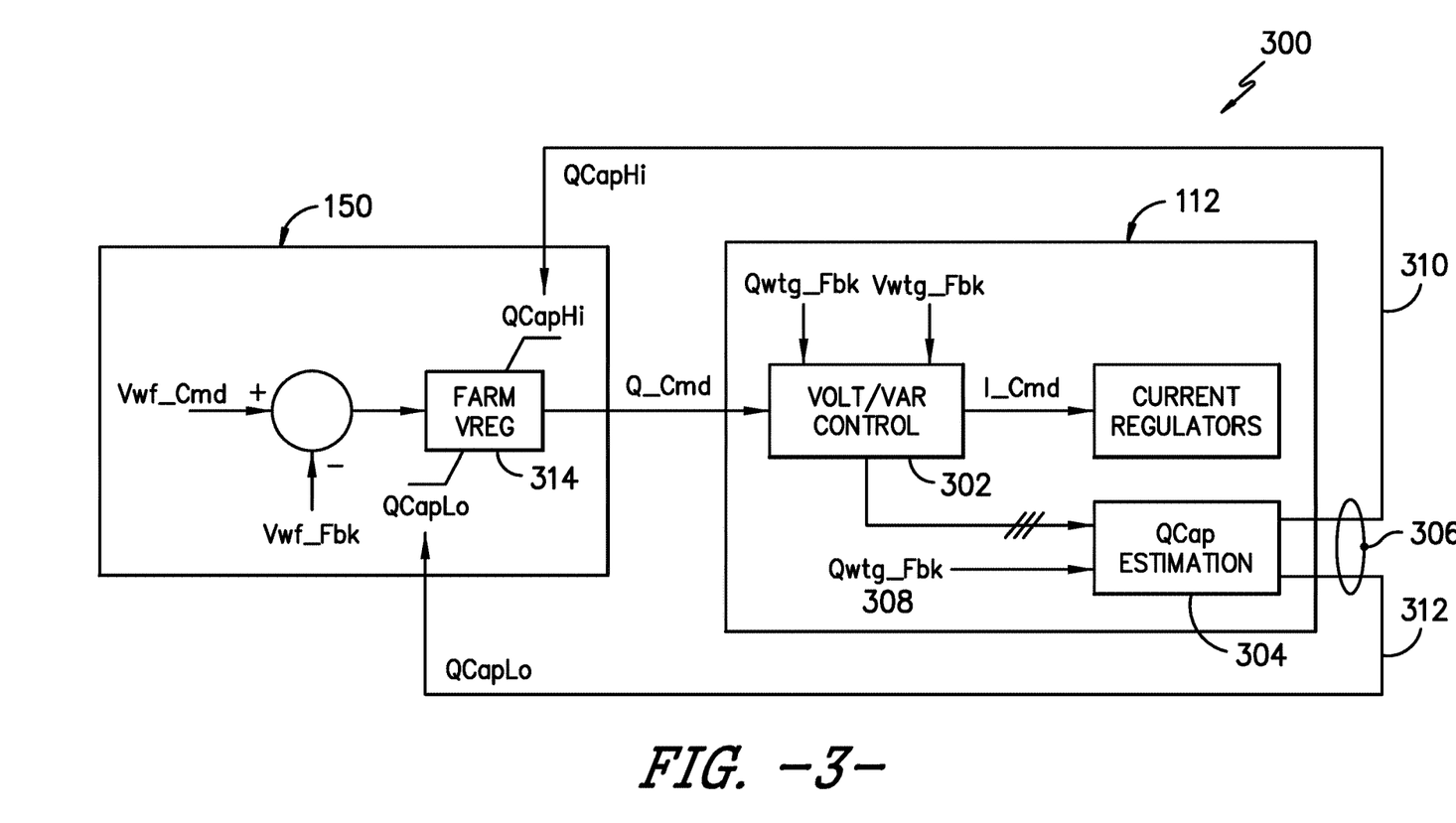
FIG. 3 illustrates a functional diagram of one embodiment of farm-level and turbine-level regulators, which utilize reactive power capability estimations according to the present disclosure.
Figure 4:
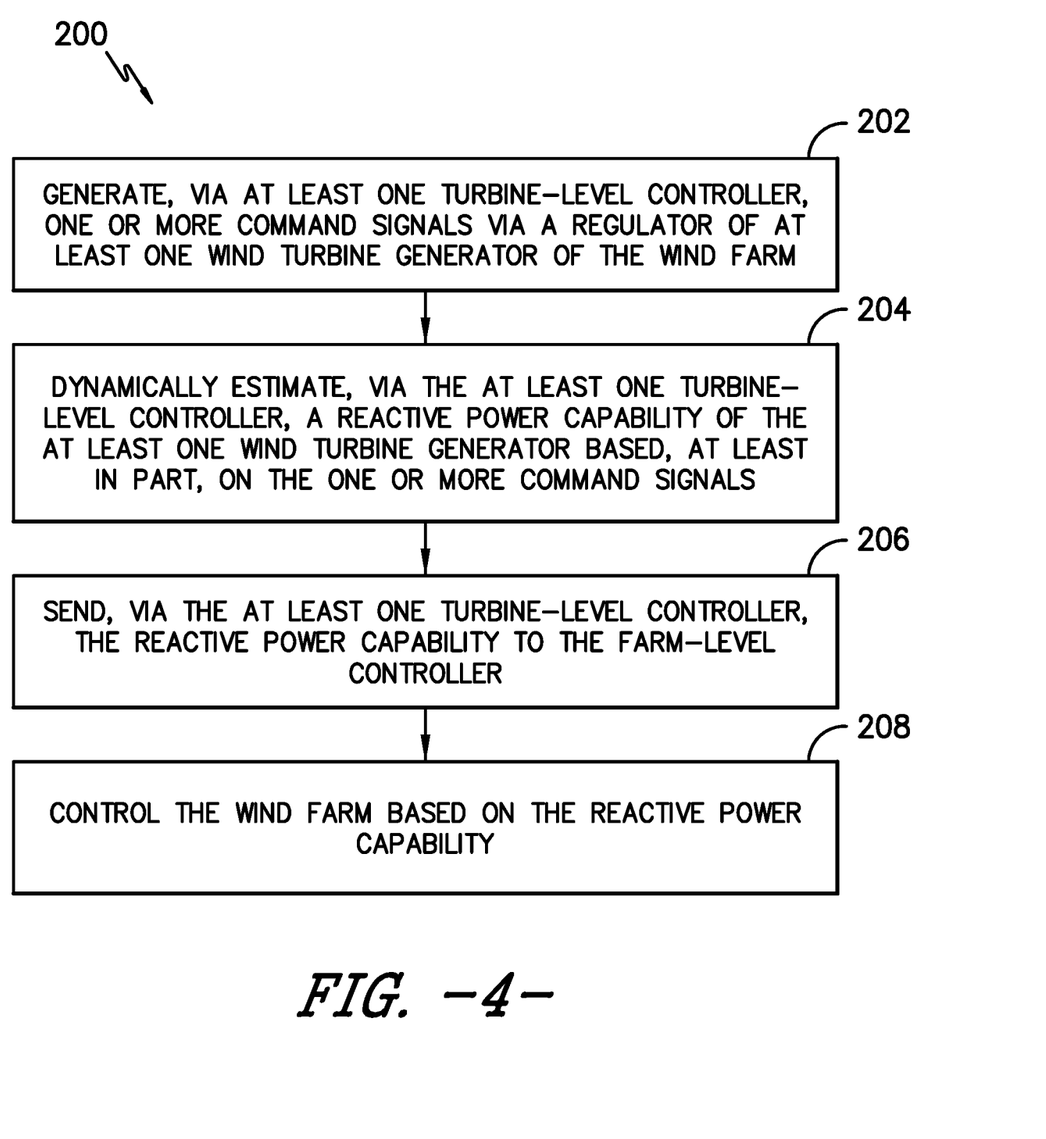
FIG. 4 illustrates a flow diagram of one embodiment of a method for controlling a wind farm according to the present disclosure.
Figure 5:
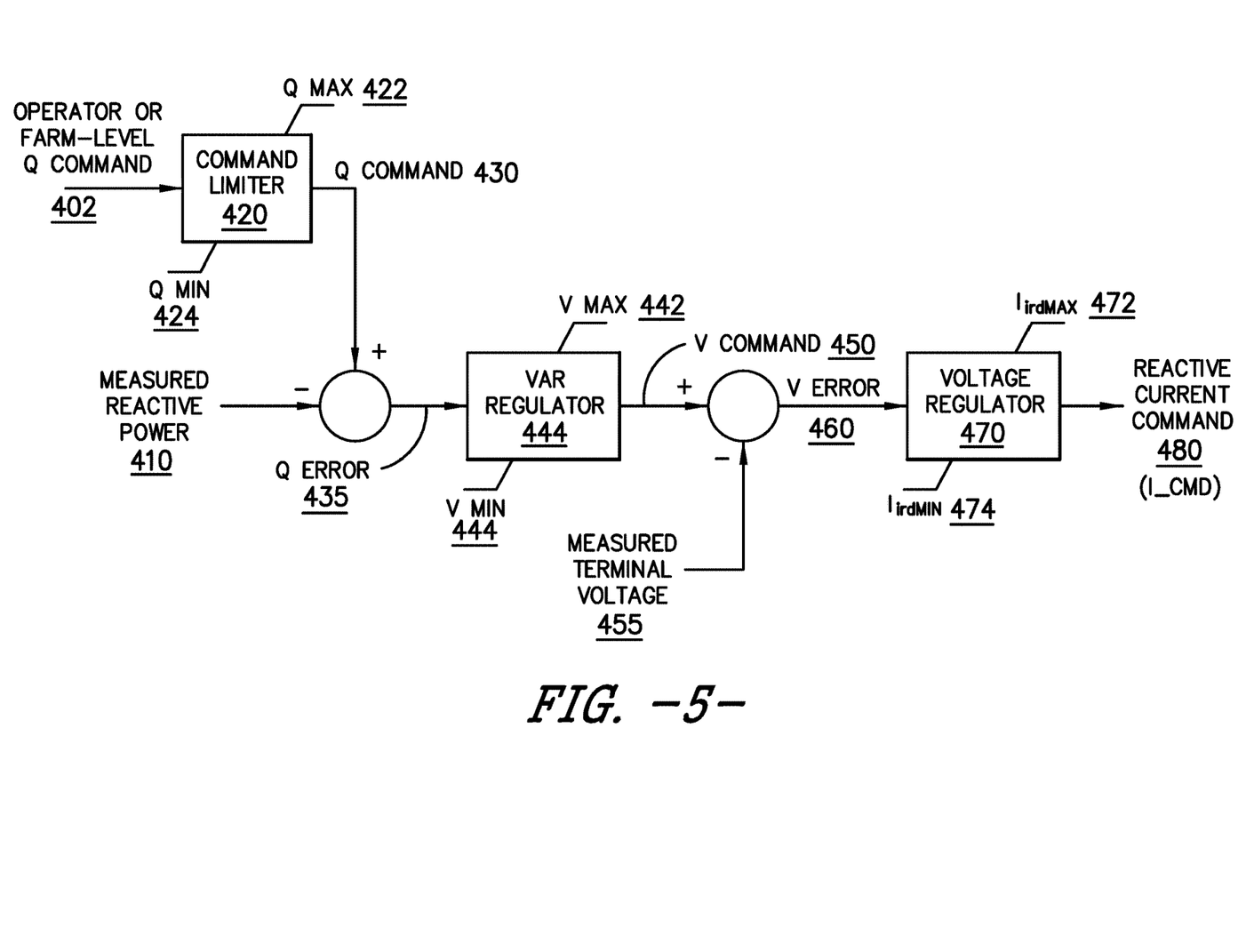
FIG. 5 illustrates a functional diagram of turbine-level control according to the present disclosure.
Figure 6:
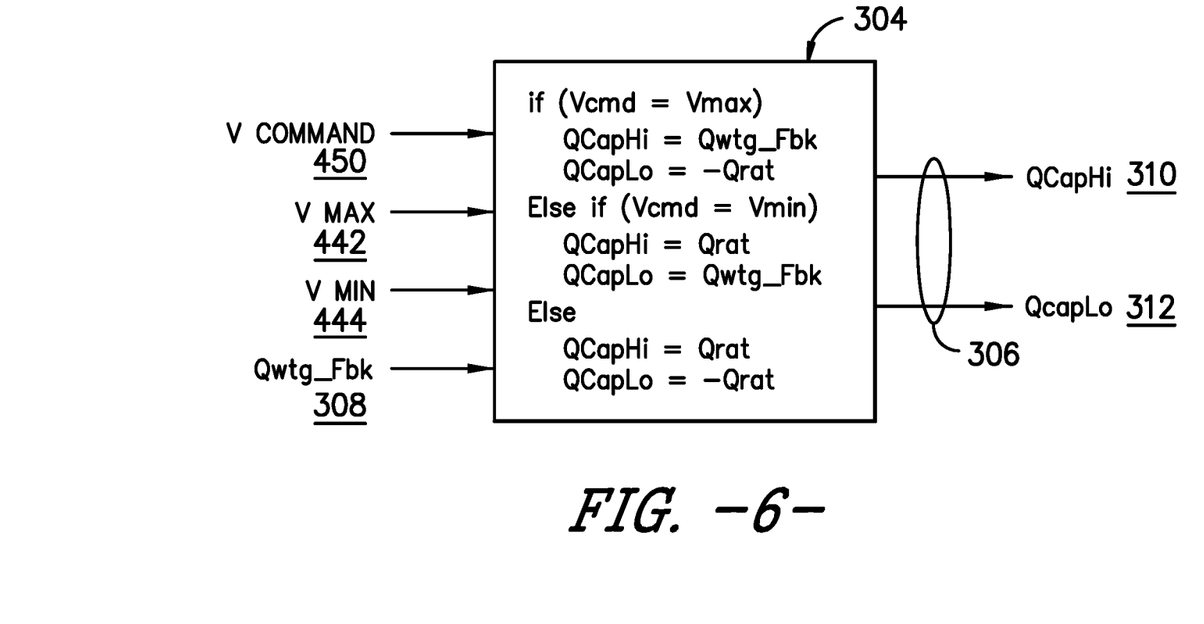
FIG. 6 illustrates a schematic diagram of one embodiment of a reactive power capability module of a turbine-level controller according to the present disclosure.

Referring now to FIGS. 3-6, embodiments of various systems and methods for controlling a wind farm by estimating reactive power capabilities at the turbine-level based on certain regulator commands reaching their limits according to the present disclosure are illustrated. In particular, FIG. 3 illustrates a functional diagram of one embodiment of farm-level and turbine-level regulators, which utilize reactive power capability estimations according to the present disclosure. FIG. 4 illustrates a flow diagram of one embodiment of a method 200 for controlling a wind farm according to the present disclosure. FIG. 5 illustrates a functional diagram of turbine-level control according to the present disclosure. FIG. 6 illustrates a schematic diagram of one embodiment of a reactive power capability module of a turbine-level controller according to the present disclosure.

Referring particularly to FIG. 3, a practical implementation of the system 300 for controlling the wind farm 100 by coordinating the volt-var capability of the wind turbine generator(s) 110 with the farm-level controller 150 is illustrated. In particular, as shown, the farm-level controller 150 may be a voltage regulator 314 with dynamic upper and lower limits (e.g. $Q_{CapHi}$ and $Q_{CapLo}$) that are determined by upper and lower reactive power capability estimations from the turbine-level controller(s) 112. More specifically, in an embodiment, the turbine-level controller(s) 112 reactive power capability estimation is determined based on volt/var control signals generated by the regulator 302. Thus, as shown, a $Q_{Cap}$ estimation module 304 for each wind turbine generator 110 is configured to estimate a reactive power capability 306. As such, the system 300 of the present disclosure takes into account whether the wind turbine generator voltage regulator 302 is reaching or exceeding an upper or lower limit. If one of the voltage command limits is being reached or exceeded, either the upper or lower reactive power capability is changed from a fixed rated value to the present value of the reactive power feedback. If the command voltage is not reaching or exceeding limits, then the upper and lower reactive power capabilities are set to the reactive power ratings of the wind turbine generator(s) 110.

Referring now to FIGS. 4-6, more detailed implementations of the system 300 of FIG. 3 are depicted and explained. In particular, in general, the method 200 described in FIG. 4 generally applies to operating the wind farm 100 described herein with respect to FIGS. 1-3. However, it should be appreciated that the disclosed method 200 may be implemented using any other power system that is configured to supply reactive power for application to a load, such as a power grid, such as a solar power system, a hydropower system, an energy storage power system, or combinations thereof. Further, FIG. 4 depicts steps performed in a particular order for purposes of illustration and discussion. Those of ordinary skill in the art, using the disclosures provided herein, will understand that various steps of any of the methods disclosed herein can be adapted, omitted, rearranged, or expanded in various ways without deviating from the scope of the present disclosure.

As shown at 202, the method 200 includes generating, via at least one turbine-level controller 112, one or more command signals via a regulator of at least one wind turbine generator 110 of the wind farm 100. For example, as shown particularly in FIG. 5, a control diagram of one embodiment of the regulator 302, e.g. that may be implemented by the turbine-level controller 112, is illustrated in accordance with aspects of the present subject matter. In several embodiments, the regulator 302 generally includes two loops: a voltage regulator loop and a Q regulator loop. The voltage regulator loop operates relatively fast (e.g., 20 rad/sec) as compared to the Q regulator loop (e.g., greater than 1 second closed loop time constant).

Conceptually, the control system of FIG. 5 provides for wind turbine generator terminal voltage control by regulating the voltage according to a reference set by a higher-than-generator-level (e.g., substation or wind farm) controller, such as the farm-level controller 150. Reactive power is regulated over a longer term (e.g., several seconds) while wind turbine generator terminal voltage is regulated over a shorter term (e.g., less than several seconds) to mitigate the effects of fast grid transients.

An operator or farm level Q command 402 is a signal that indicates desired reactive power at the generator terminals. In farm-level operation, the wind turbine generator Q command 402 is set equal to the output of the farm level control (line 105 in FIG. 1). In local control, the operator command is set manually, either at the wind generator location or at a remote location. The operator or farm level Q command 402 can be generated or transmitted by, for example, a computer system used to control the wind turbine generator. The operator or farm level Q command 402 can also come from a utility grid operator or substation.

In one embodiment, as shown, the operator or farm level Q command 402 is transmitted to a command limiter 420, which operates to maintain reactive power commands within a predetermined range. Further, as shown in FIG. 5, $Q_{MAX}$ 422 and $Q_{MIN}$ 424 may generally indicate the upper and lower bounds on the reactive power command range. Moreover, in an embodiment, the specific values used for $Q_{MAX}$ 422 and $Q_{MIN}$ 424 may be based on, for example, generator reactive capabilities. In one embodiment, as an example, the value for $Q_{MAX}$ 422 may be 800 kVAR and the value for $Q_{MIN}$ 424 may be −1200 kVAR for a 1.5 MW wind turbine generator. However, it should be readily appreciated that the specific values for $Q_{MAX}$ 422 and $Q_{MIN}$ 424 may generally depend upon the capability of the specific generators being used.

Still referring to FIG. 5, the signal output by the command limiter 420 is a Q command 430, which is a command indicating the target reactive power to be produced. The Q command 430 is in the range between $Q_{MAX}$ 422 and $Q_{MIN}$ 424. Additionally, as shown, the Q command 430 may be compared to a signal indicating measured reactive power 410. The resulting error signal, Q error 435, indicates the difference between the measured reactive power and the commanded reactive power.

The Q error 435 is an input signal to a reactive power regulator 440 (hereinafter referred to as the VAR regulator 440), which generates a voltage setpoint 450 (hereinafter referred to as the V command 450) that indicates to a wind turbine generator 110 the reactive power to be provided by the generator. In one embodiment, the VAR regulator 440 may be a proportional integral (PI) controller that has a closed-loop time constant in the range of 1 to 10 seconds (e.g., 3 seconds, 5 seconds, 5.5 seconds). Other types of controllers may be also be used, for example, proportional derivative (PD) controllers, proportional integral derivative (PID) controllers, state space controllers, etc. Additionally, other time constants can be used for the VAR regulator 440 provided that the time constant for the VAR regulator 440 is numerically greater than the time constant for a voltage regulator 470 (described below).

In several embodiments, the V command 450 may be limited to a predetermined range between $V_{MAX}$ 442 and $V_{MIN}$ 444. For example, in one embodiment, $V_{MAX}$ 442 and $V_{MIN}$ 444 may be defined in terms of a percentage of the rated generator output, such as by defining $V_{MAX}$ 442 as 105% of the rated generator voltage while defining $V_{MIN}$ 444 can be 95% of the rated generator voltage. However, it should be appreciated that alternate upper and lower limits may also be used.

Referring still to FIG. 5, the V command 450 derived from the VAR regulator 440 may be compared to a signal indicating a measured terminal voltage 455 for the generator 110. The difference between the V command 450 and the measured terminal voltage 455 is a voltage error signal 460. Further, as shown, the voltage error signal 460 is then input into a voltage regulator 470 of the disclosed system 402, which may be limited to a predetermined range between $I_{irdMAX}$ 472 and $I_{irdMIN}$ 474. As such, the voltage regulator 470 generates a reactive current command 480, which is used to control generator reactive current and, thus, generator reactive power ($Q_{wg}$ in FIG. 1). In one embodiment, the voltage regulator 470 is a PI controller that has a closed-loop time constant of approximately 50 milliseconds. Other types of controllers can also be used, for example, PD controllers, PID controllers, etc. In addition, other time constants may also be used (e.g., 1 second, 20 milliseconds, 75 milliseconds, 45 milliseconds) for the voltage regulator 470 provided that the time constant for the regulator 470 is less than the time constant for the VAR regulator 440.

Referring back to FIG. 4, as shown at 204, the method 200 includes dynamically estimating, via the turbine-level controller(s) 112, a reactive power capability of the wind turbine generator(s) 110 based, at least in part, on the command signal(s) (e.g. such as the V command signal 450). More specifically, as shown in FIG. 6, in an embodiment, the $Q_{Cap}$ estimation module 304 is configured to dynamically estimate the reactive power capability 306 of the wind turbine generator(s) 110 based the V command signal 450, upper and lower limits (e.g. $V_{MAX}$ 442 and $V_{MIN}$ 444) of the regulator 302 and/or a reactive power feedback signal 308 (e.g. Qwtg_Fbk), or combinations thereof. The reactive power feedback signal 308, as described herein, generally refers to a measured value, e.g. such as measured via one or more sensors. In particular embodiments, as shown in FIGS. 3 and 6, the reactive power capability 306 may include a reactive power capability upper value 310 and a reactive power capability lower value 312.

Accordingly, in an embodiment, as shown in FIG. 6, the $Q_{Cap}$ estimation module 304 may include various algorithms, look-up tables, and/or equations for dynamically estimating the reactive power capability 306 of the wind turbine generator(s) 110. In one embodiment, as shown, if the one or more command signals ($V_{CMD}$) equals the upper limit ($V_{MAX}$), then the reactive power capability upper limit ($Q_{CapHi}$) may equal (i.e. may be set to) the reactive power feedback signal (Qwtg_Fbk) and the reactive power capability lower limit ($Q_{CapLo}$) may equal (i.e. may be set to) a lower reactive power equipment rating ($-Q_{rat}$) for the wind turbine generator(s) 110. Moreover, if the one or more command signals ($V_{CMD}$) equals the lower limit ($V_{MIN}$), then the reactive power capability upper limit ($Q_{CapHi}$) may equal (i.e. may be set to) a upper reactive power equipment rating ($Q_{rat}$) for the wind turbine generator(s) 110 and the reactive power capability lower limit ($Q_{CapLo}$) may equal (i.e. may be set to) the reactive power feedback signal (Qwtg_Fbk). Still referring to FIG. 6, if the one or more command signals do not equal the upper or lower limits (represented by ELSE), then the reactive power capability upper limit ($Q_{CapHi}$) may equal (i.e. may be set to) the upper reactive power equipment rating ($Q_{rat}$) for the wind turbine generator(s) 110 and the reactive power capability lower limit ($Q_{CapLo}$) may equal (i.e. may be set to) the lower reactive power equipment rating ($-Q_{rat}$) for the wind turbine generator(s) 110.

Accordingly, referring back to FIG. 4, as shown at 206, the method 200 includes sending, via the turbine-level controller(s) 112, the reactive power capability to the farm-level controller 150. For example, in an embodiment, as shown in FIG. 3, the turbine-level controller(s) 112 is configured to send the reactive power capability upper value 310 and the reactive power capability lower value 312 to the farm-level controller 150 and set upper and lower limits of the regulator 314 of the farm-level controller 150 equal to the reactive power capability upper and lower values 310, 312.

Referring back to FIG. 4, as shown at 208, the method 200 then includes controlling the wind farm 100 based on the reactive power capability. In certain embodiments, for example, controlling the wind farm 100 based on the reactive power capability 306 described herein may include generating a reactive power command (Q_Cmd) for the wind turbine generator(s) 110 using the regulator 314 of the farm-level controller 150 with the reactive power capability upper and lower values 310, 312 set as the upper and lower limits of the regulator 314 of the farm-level controller 150.

The concept for coordinating the reactive power capability of the wind turbine generator(s) 110 with the farm-level controller 150 can be extended to a multiple wind turbines, for example, by totaling farm upper and lower reactive power capabilities from each wind turbine, respectively. Further, in such embodiments, the total farm-level reactive power command (Q_Cmd) may be limited by the total farm upper capability and total farm lower capability. This total farm Q_Cmd can then distributed among the individual wind turbine generators 110 within the wind farm 100 in such a way to enforce the individual capability limits of each wind turbine generator 110 and meeting the total Q_Cmd requested by the farm control. In scenario's where portions of the wind turbine generators 110 are constrained on reactive power capability, these wind turbine generators 110 can receive a different reactive power command from the farm controller than the un-constrained wind turbine generators 110.

In such embodiments, the method 200 may further include generating, via a plurality of turbine-level controllers 112, a plurality of the one or more command signals via a plurality of regulator from the plurality of wind turbine generators 110, dynamically estimating, via the plurality of turbine-level controllers 112, a plurality of reactive power capabilities for the wind turbine generators 110 based, at least in part, on the plurality of the one or more command signals, sending, via the plurality of turbine-level controllers 112, the plurality of reactive power capabilities for the wind turbine generators 110 to the farm-level controller 150, and controlling the wind farm 100 based on the plurality of reactive power capabilities.

Further aspects of the invention are provided by the subject matter of the following clauses:

Clause 1. A method for controlling a power system, the method comprising:

generating, via at least one inverter-based resource of the power system, one or more command signals via a regulator of at least one inverter-based resource;

dynamically estimating, via the at least one inverter-based resource, a reactive power capability of the at least one inverter-based resource based, at least in part, on a reactive power feedback signal and the one or more command signals;

sending, via the at least one inverter-based resource, the reactive power capability to a system-level controller of the power system; and, controlling the power system based on the reactive power capability.

Clause 2. The method of clause 1, wherein the one or more command signals comprise at least one of voltage command signals, reactive power command signals, or reactive current command signals.

Clause 3. The method of clauses 1-2, further comprising dynamically estimating the reactive power capability of the at least one inverter-based resource based, at least in part, on the one or more command signals and upper and lower limits of the regulator.

Clause 4. The method of any of the preceding clauses, wherein the reactive power capability comprises a reactive power capability upper value and a reactive power capability lower value.

Clause 5. The method of any of the preceding clauses, wherein dynamically estimating the reactive power capability of the at least one inverter-based resource further comprises:

if the one or more command signals equal the upper limit, then setting the reactive power capability upper value equal to the reactive power feedback signal and the reactive power capability lower value equal to a lower reactive power equipment rating for the at least one inverter-based resource.

Clause 6. The method of any of the preceding clauses, wherein dynamically estimating the reactive power capability of the at least one inverter-based resource further comprises:

if the one or more command signals equal the lower limit, then setting the reactive power capability upper value equal to a upper reactive power equipment rating for the at least one inverter-based resource and the reactive power capability lower value equal to the reactive power feedback signal.

Clause 7. The method of any of the preceding clauses, wherein dynamically estimating the reactive power capability of the at least one inverter-based resource further comprises:

if the one or more command signals do not equal the upper or lower limits, then setting the reactive power capability upper value equal to the upper reactive power equipment rating for the at least one inverter-based resource and the reactive power capability lower value equal to the lower reactive power equipment rating for the at least one inverter-based resource.

Clause 8. The method of any of the preceding clauses, wherein sending the reactive power capability to the system-level controller further comprises:

sending, via the at least one inverter-based resource, the reactive power capability upper value and the reactive power capability lower value to the system-level controller; and, setting upper and lower limits of a regulator of the system-level controller equal to the reactive power capability upper and lower values from the at least one inverter-based resource.

Clause 9. The method of any of the preceding clauses, wherein controlling the power system based on the reactive power capability further comprises:

generating a reactive power command for the at least one inverter-based resource using the regulator of the system-level controller with the reactive power capability upper and lower values from the at least one inverter-based resource set as the upper and lower limits of the regulator of the system-level controller.

Clause 10. The method of any of the preceding clauses, wherein the power system comprises a plurality of inverter-based resources, the at least one inverter-based resource being one of the plurality of inverter-based resources.

Clause 11. The method of any of the preceding clauses, further comprising:

generating, via a plurality of inverter-based resources, a plurality of the one or more command signals via a plurality of regulators from the plurality of inverter-based resources;

dynamically estimating, via the plurality of inverter-based resources, a plurality of reactive power capabilities for the inverter-based resources based, at least in part, on the plurality of the one or more command signals;

sending, via the plurality of inverter-based resources, the plurality of reactive power capabilities for the inverter-based resources to the system-level controller; and, controlling the power system based on the plurality of reactive power capabilities.

Clause 12. A wind farm, comprising:

a plurality of wind turbine generators;

a plurality of turbine-level controllers for controlling the plurality of wind turbine generators; and, a farm-level controller commutatively coupled to the plurality of turbine-level controllers, wherein each of the turbine-level controllers perform a plurality of operations, the plurality of operations comprising:

generating one or more command signals via a regulator of a respective wind turbine generator of the plurality of wind turbine generators of the wind farm;

dynamically estimating a reactive power capability of the respective wind turbine generator based, at least in part, on a reactive power feedback signal and the one or more command signals; and, sending the reactive power capability to the farm-level controller, and wherein the farm-level controller controls the wind farm based on the reactive power capability.

Clause 13. The wind farm of clause 12, further comprising dynamically estimating the reactive power capability of the respective wind turbine generator based, at least in part, on the one or more command signals and upper and lower limits of the regulators.

Clause 14. The wind farm of clauses 12-13, wherein the reactive power capability comprises a reactive power capability upper value and a reactive power capability lower value.

Clause 15. The wind farm of clauses 12-14, wherein dynamically estimating the reactive power capability of the respective wind turbine generator further comprises:

if the one or more command signals equal the upper limit, then setting the reactive power capability upper value equal to the reactive power feedback signal and the reactive power capability lower value equal to a lower reactive power equipment rating for the respective wind turbine generator.

Clause 16. The wind farm of clauses 12-15, wherein dynamically estimating the reactive power capability of the respective wind turbine generator further comprises:

if the one or more command signals equal the lower limit, then setting the reactive power capability upper value equal to a upper reactive power equipment rating for the respective wind turbine generator and the reactive power capability lower value equal to the reactive power feedback signal.

Clause 17. The wind farm of clauses 12-16, wherein dynamically estimating the reactive power capability of the respective wind turbine generator further comprises:

if the one or more command signals do not equal the upper or lower limits, then setting the reactive power capability upper value equal to the upper reactive power equipment rating for the respective wind turbine generator and the reactive power capability lower value equal to the lower reactive power equipment rating for the respective wind turbine generator.

Clause 18. The wind farm of clauses 12-17, wherein sending the reactive power capability to the farm-level controller further comprises:

sending the reactive power capability upper value and the reactive power capability lower value to the farm-level controller; and, setting upper and lower limits of a regulator of the farm-level controller equal to the reactive power capability upper and lower values from one or more of the plurality of turbine-level controllers, and wherein controlling the wind farm based on the reactive power capability further comprises:

generating a reactive power command for one or more of the plurality of wind turbine generators using the regulator of the farm-level controller with the reactive power capability upper and lower values from one or more of the plurality of turbine-level controllers set as the upper and lower limits of the regulator of the farm-level controller.

Clause 19. The wind farm of clauses 12-18, wherein the reactive power commands are distributed to the plurality of inverter-based resources so as to have unconstrained inverter-based resources within the power system compensate for any reduction in reactive power capabilities due to constrained inverter-based resources within the power system.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for controlling a power system, the method comprising:

generating, via at least one inverter-based resource of the power system, one or more command signals via a regulator of at least one inverter-based resource;

dynamically estimating, via the at least one inverter-based resource, a reactive power capability of the at least one inverter-based resource based, at least in part, on a reactive power feedback signal, the one or more command signals, and upper and lower limits of the regulator, wherein the reactive power capability comprises a reactive power capability upper value and a reactive power capability lower value, and wherein if the one or more command signals equal the upper limit, then setting the reactive power capability upper value equal to the reactive power feedback signal and the reactive power capability lower value equal to a lower reactive power equipment rating for the at least one inverter-based resource;

sending, via the at least one inverter-based resource, the reactive power capability to a system-level controller of the power system; and, controlling the power system based on the reactive power capability.

2. The method of claim 1, wherein the one or more command signals comprise at least one of voltage command signals, reactive power command signals, or reactive current command signals.

3. The method of claim 1, wherein dynamically estimating the reactive power capability of the at least one inverter-based resource further comprises:

if the one or more command signals equal the lower limit, then setting the reactive power capability upper value equal to a upper reactive power equipment rating for the at least one inverter-based resource and the reactive power capability lower value equal to the reactive power feedback signal.

4. The method of claim 1, wherein dynamically estimating the reactive power capability of the at least one inverter-based resource further comprises:
if the one or more command signals do not equal the upper or lower limits, then setting the reactive power capability upper value equal to the upper reactive power equipment rating for the at least one inverter-based resource and the reactive power capability lower value equal to the lower reactive power equipment rating for the at least one inverter-based resource.

5. The method of claim 1, wherein sending the reactive power capability to the system-level controller further comprises:
sending, via the at least one inverter-based resource, the reactive power capability upper value and the reactive power capability lower value to the system-level controller; and,
setting upper and lower limits of a regulator of the system-level controller equal to the reactive power capability upper and lower values from the at least one inverter-based resource.

6. The method of claim 5, wherein controlling the power system based on the reactive power capability further comprises:
generating a reactive power command for the at least one inverter-based resource using the regulator of the system-level controller with the reactive power capability upper and lower values from the at least one inverter-based resource set as the upper and lower limits of the regulator of the system-level controller.

7. The method of claim 6, wherein the power system comprises a plurality of inverter-based resources, the at least one inverter-based resource being one of the plurality of inverter-based resources.

8. The method of claim 7, further comprising:
generating, via a plurality of inverter-based resources, a plurality of the one or more command signals via a plurality of regulators from the plurality of inverter-based resources;
dynamically estimating, via the plurality of inverter-based resources, a plurality of reactive power capabilities for the inverter-based resources based, at least in part, on the plurality of the one or more command signals;
sending, via the plurality of inverter-based resources, the plurality of reactive power capabilities for the inverter-based resources to the system-level controller; and,
controlling the power system based on the plurality of reactive power capabilities.

9. A wind farm, comprising:
a plurality of wind turbine generators;
a plurality of turbine-level controllers for controlling the plurality of wind turbine generators; and,
a farm-level controller commutatively coupled to the plurality of turbine-level controllers,
wherein each of the turbine-level controllers perform a plurality of operations, the plurality of operations comprising:
generating one or more command signals via a regulator of a respective wind turbine generator of the plurality of wind turbine generators of the wind farm;
dynamically estimating a reactive power capability of the respective wind turbine generator based, at least in part, on a reactive power feedback signal, the one or more command signals, and upper and lower limits of the regulator, wherein the reactive power capability comprises a reactive power capability upper value and a reactive power capability lower value, and wherein if the one or more command signals equal the upper limit, then setting the reactive power capability upper value equal to the reactive power feedback signal and the reactive power capability lower value equal to a lower reactive power equipment rating for the at least one inverter-based resource; and,
sending the reactive power capability to the farm-level controller, wherein the farm-level controller controls the wind farm based on the reactive power capability.

10. The wind farm of claim 9, wherein dynamically estimating the reactive power capability of the respective wind turbine generator further comprises:
if the one or more command signals equal the lower limit, then setting the reactive power capability upper value equal to a upper reactive power equipment rating for the respective wind turbine generator and the reactive power capability lower value equal to the reactive power feedback signal.

11. The wind farm of claim 10, wherein dynamically estimating the reactive power capability of the respective wind turbine generator further comprises:
if the one or more command signals do not equal the upper or lower limits, then setting the reactive power capability upper value equal to the upper reactive power equipment rating for the respective wind turbine generator and the reactive power capability lower value equal to the lower reactive power equipment rating for the respective wind turbine generator.

12. The wind farm of claim 9, wherein sending the reactive power capability to the farm-level controller further comprises:
sending the reactive power capability upper value and the reactive power capability lower value to the farm-level controller; and,
setting upper and lower limits of a regulator of the farm-level controller equal to the reactive power capability upper and lower values from one or more of the plurality of turbine-level controllers, and
wherein controlling the wind farm based on the reactive power capability further comprises:
generating a reactive power command for one or more of the plurality of wind turbine generators using the regulator of the farm-level controller with the reactive power capability upper and lower values from one or more of the plurality of turbine-level controllers set as the upper and lower limits of the regulator of the farm-level controller.

13. The wind farm of claim 12, wherein the reactive power commands are distributed to the plurality of inverter-based resources so as to have unconstrained inverter-based resources within the power system compensate for any reduction in reactive power capabilities due to constrained inverter-based resources within the power system.

* * * * *